US006964793B2

(12) United States Patent
Willson et al.

(10) Patent No.: US 6,964,793 B2
(45) Date of Patent: Nov. 15, 2005

(54) METHOD FOR FABRICATING NANOSCALE PATTERNS IN LIGHT CURABLE COMPOSITIONS USING AN ELECTRIC FIELD

(75) Inventors: Carlton Grant Willson, Austin, TX (US); Sidlgata V. Sreenivasan, Austin, TX (US); Roger T. Bonnecaze, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 106 days.

(21) Appl. No.: 09/905,718

(22) Filed: May 16, 2001

(65) Prior Publication Data

US 2003/0215577 A1 Nov. 20, 2003

(51) Int. Cl.[7] .................................................. B05D 1/32
(52) U.S. Cl. .................... 427/466; 427/256; 427/385.5; 427/595
(58) Field of Search ................................ 427/466, 458, 427/459, 595, 385.5, 256

(56) References Cited

U.S. PATENT DOCUMENTS

| | | |
|---|---|---|
| 3,757,846 A | 9/1973 | Herman Jr. |
| 3,783,520 A | 1/1974 | King |
| 3,807,027 A | 4/1974 | Heisler |
| 3,807,029 A | 4/1974 | Troeger |
| 3,811,665 A | 5/1974 | Seelig |
| 4,062,600 A | 12/1977 | Wyse |
| 4,070,116 A | 1/1978 | Frosch et al. |

(Continued)

FOREIGN PATENT DOCUMENTS

| | | |
|---|---|---|
| DE | 2800476 | 7/1978 |
| DE | 19648844 | 9/1997 |
| EP | 244884 | 3/1987 |
| EP | 733455 | 9/1996 |
| JP | 55-88332 | 12/1978 |
| JP | 57-7931 | 6/1980 |
| JP | 63-138730 | 12/1986 |

(Continued)

OTHER PUBLICATIONS

Stewart, "A Platform with Six Degrees of Freedom," Proc. of Inst. Mech. Engrs., 1965, pp. 371–378, vol. 180 pt. 1, No. 15, no month avail.

Paros et al., "How to Design Flexure Hinges," Machine Design, Nov. 25, 1965, pp. 151–156.

Raibert et al., "Hybrid Position/Force Control of Manipulators," Transactions of the ASME, Journal of Dynamic Systems, Measurement and Control, Jun. 1981, pp. 126–133, vol. 102.

(Continued)

Primary Examiner—Bernard Pianalto
(74) Attorney, Agent, or Firm—Kenneth C. Brooks

(57) ABSTRACT

A high-throughput lithography process for creating high-resolution patterns in a polymerizable composition using carefully controlled electric field followed by curing of the polymerizable composition is described. The process involves the use of a template that includes the desired patterns. This template is brought into close proximity to the polymerizable composition on the substrate. An external electric file is applied to the template-substrate interface while maintaining a uniform, carefully controlled gap between the template and substrate. This causes the polymerizable composition to be attracted to the raised portions of the template. By appropriately choosing the various process parameters such as the viscosity of the polymerizable composition, the magnitude of the electric field, and the distance between the template and substrate, the resolution of the structures formed in the liquid may be controlled to conform to that of the template.

17 Claims, 7 Drawing Sheets

U.S. PATENT DOCUMENTS

| | | |
|---|---|---|
| 4,098,001 A | 7/1978 | Watson |
| 4,119,688 A | 10/1978 | Hiraoka |
| 4,155,169 A | 5/1979 | Drake et al. |
| 4,201,800 A | 5/1980 | Alcorn et al. |
| 4,202,107 A | 5/1980 | Watson |
| 4,267,212 A | 5/1981 | Sakawaki |
| 4,337,579 A | 7/1982 | De Fazio |
| 4,355,469 A | 10/1982 | Nevins et al. |
| 4,414,750 A | 11/1983 | De Fazio |
| 4,426,247 A | 1/1984 | Tamamura et al. |
| 4,440,804 A | 4/1984 | Milgram |
| 4,451,507 A | 5/1984 | Beltz et al. |
| 4,507,331 A | 3/1985 | Hiraoka |
| 4,512,386 A | 4/1985 | Haller |
| 4,512,848 A | 4/1985 | Deckman et al. |
| 4,544,572 A | 10/1985 | Sandvig et al. |
| 4,552,833 A | 11/1985 | Ito et al. |
| 4,600,309 A | 7/1986 | Fay |
| 4,610,442 A | 9/1986 | Oku et al. |
| 4,657,845 A | 4/1987 | Frechet et al. |
| 4,692,205 A | 9/1987 | Sachdev et al. |
| 4,694,703 A | 9/1987 | Routson |
| 4,707,218 A | 11/1987 | Giammarco et al. |
| 4,731,155 A | 3/1988 | Napoli et al. |
| 4,737,425 A | 4/1988 | Lin et al. |
| 4,763,886 A | 8/1988 | Takei |
| 4,808,511 A | 2/1989 | Holmes |
| 4,826,943 A | 5/1989 | Ito et al. |
| 4,848,911 A | 7/1989 | Uchida et al. |
| 4,857,477 A | 8/1989 | Kanamori |
| 4,891,303 A | 1/1990 | Garza et al. |
| 4,908,298 A | 3/1990 | Hefferon et al. |
| 4,919,748 A | 4/1990 | Bredbenner et al. |
| 4,921,778 A | 5/1990 | Thackeray et al. |
| 4,929,083 A | 5/1990 | Brunner |
| 4,931,351 A | 6/1990 | McColgin et al. |
| 4,959,252 A | 9/1990 | Bonnebat et al. |
| 4,964,945 A | 10/1990 | Calhoun |
| 4,976,818 A | 12/1990 | Hashimoto et al. |
| 4,980,316 A | 12/1990 | Huebner |
| 4,982,796 A | 1/1991 | Lari et al. |
| 4,999,280 A | 3/1991 | Hiraoka |
| 5,028,366 A | 7/1991 | Harakal et al. |
| 5,053,318 A | 10/1991 | Gulla et al. |
| 5,071,694 A | 12/1991 | Uekita et al. |
| 5,072,126 A | 12/1991 | Progler |
| 5,074,667 A | 12/1991 | Miyatake |
| 5,108,875 A | 4/1992 | Thackeray et al. |
| 5,110,514 A | 5/1992 | Soane |
| 5,126,006 A | 6/1992 | Cronin et al. |
| 5,148,036 A | 9/1992 | Matsugu et al. |
| 5,148,037 A | 9/1992 | Suda et al. |
| 5,151,754 A | 9/1992 | Ishibashi et al. |
| 5,169,494 A | 12/1992 | Hashimoto et al. |
| 5,173,393 A | 12/1992 | Sezi et al. |
| 5,179,863 A | 1/1993 | Uchida et al. |
| 5,198,326 A | 3/1993 | Hashimoto et al. |
| 5,204,739 A | 4/1993 | Domenicali |
| 5,212,147 A | 5/1993 | Sheats |
| 5,234,793 A | 8/1993 | Sebald et al. |
| 5,240,550 A | 8/1993 | Boehnke et al. |
| 5,240,878 A | 8/1993 | Fitzsimmons et al. |
| 5,242,711 A | 9/1993 | DeNatale et al. |
| 5,244,818 A | 9/1993 | Jokerst et al. |
| 5,314,772 A | 5/1994 | Kozicki et al. |
| 5,318,870 A | 6/1994 | Hartney |
| 5,324,683 A | 6/1994 | Fitch et al. |
| 5,328,810 A | 7/1994 | Lowrey et al. |
| 5,330,881 A | 7/1994 | Sidman et al. |
| 5,348,616 A | 9/1994 | Hartman et al. |
| 5,362,606 A | 11/1994 | Hartney et al. |
| 5,366,851 A | 11/1994 | Novembre |
| 5,374,454 A | 12/1994 | Bickford et al. |
| 5,376,810 A | 12/1994 | Hoenk et al. |
| 5,380,474 A | 1/1995 | Rye et al. |
| 5,392,123 A | 2/1995 | Marcus et al. |
| 5,417,802 A | 5/1995 | Obeng |
| 5,421,981 A | 6/1995 | Leader et al. |
| 5,422,295 A | 6/1995 | Choi et al. |
| 5,424,549 A | 6/1995 | Feldman |
| 5,425,848 A | 6/1995 | Haisma et al. |
| 5,425,964 A | 6/1995 | Southwell et al. |
| 5,431,777 A | 7/1995 | Austin et al. |
| 5,439,766 A | 8/1995 | Day et al. |
| 5,452,090 A | 9/1995 | Progler et al. |
| 5,453,157 A | 9/1995 | Jeng |
| 5,458,520 A | 10/1995 | DeMercurio et al. |
| 5,468,542 A | 11/1995 | Crouch |
| 5,480,047 A | 1/1996 | Tanigawa et al. |
| 5,512,131 A | 4/1996 | Kumar et al. |
| 5,515,167 A | 5/1996 | Ledger et al. |
| 5,527,662 A | 6/1996 | Hashimoto et al. |
| 5,545,367 A | 8/1996 | Bae et al. |
| 5,566,584 A | 10/1996 | Briganti |
| 5,601,641 A | 2/1997 | Stephens |
| 5,633,505 A | 5/1997 | Chung et al. |
| 5,654,238 A | 8/1997 | Cronin et al. |
| 5,670,415 A | 9/1997 | Rust |
| 5,700,626 A | 12/1997 | Lee et al. |
| 5,723,176 A | 3/1998 | Keyworth et al. |
| 5,724,145 A | 3/1998 | Kondo et al. |
| 5,736,424 A | 4/1998 | Prybyla et al. |
| 5,743,998 A | 4/1998 | Park |
| 5,747,102 A | 5/1998 | Smith et al. |
| 5,753,014 A | 5/1998 | Van Rijn |
| 5,760,500 A | 6/1998 | Kondo et al. |
| 5,772,905 A | 6/1998 | Chou |
| 5,776,748 A | 7/1998 | Singhvi et al. |
| 5,779,799 A | 7/1998 | Davis |
| 5,802,914 A | 9/1998 | Fassler et al. |
| 5,804,474 A | 9/1998 | Sakaki et al. |
| 5,849,209 A | 12/1998 | Kindt-Larsen et al. |
| 5,849,222 A | 12/1998 | Jen et al. |
| 5,855,686 A | 1/1999 | Rust |
| 5,877,036 A | 3/1999 | Kawai |
| 5,877,861 A | 3/1999 | Ausschnitt et al. |
| 5,884,292 A | 3/1999 | Baker et al. |
| 5,888,650 A | 3/1999 | Calhoun et al. |
| 5,895,263 A | 4/1999 | Carter et al. |
| 5,900,160 A | 5/1999 | Whitesides et al. |
| 5,907,782 A | 5/1999 | Wu |
| 5,912,049 A | 6/1999 | Shirley |
| 5,926,690 A | 7/1999 | Toprac et al. |
| 5,942,871 A | 8/1999 | Lee |
| 5,948,219 A | 9/1999 | Rohner |
| 5,948,470 A | 9/1999 | Harrison et al. |
| 5,948,570 A | 9/1999 | Kornblit et al. |
| 5,952,127 A | 9/1999 | Yamanaka |
| 6,033,977 A | 3/2000 | Gutsche et al. |
| 6,035,805 A | 3/2000 | Rust |
| 6,038,280 A | 3/2000 | Rossiger et al. |
| 6,039,897 A | 3/2000 | Lochhead et al. |
| 6,046,056 A | 4/2000 | Parce et al. |
| 6,051,345 A | 4/2000 | Huang |
| 6,074,827 A | 6/2000 | Nelson et al. |
| 6,091,485 A | 7/2000 | Li et al. |
| 6,096,655 A | 8/2000 | Lee et al. |
| 6,125,183 A | 9/2000 | Jiawook et al. |
| 6,128,085 A | 10/2000 | Buermann et al. |
| 6,143,412 A | 11/2000 | Schueller et al. |
| 6,150,231 A | 11/2000 | Muller et al. |

| | | |
|---|---|---|
| 6,150,680 A | 11/2000 | Eastman et al. |
| 6,168,845 B1 | 1/2001 | Fontana, Jr. et al. |
| 6,180,239 B1 | 1/2001 | Whitesides et al. |
| 6,204,922 B1 | 3/2001 | Chalmers |
| 6,218,316 B1 | 4/2001 | Marsh |
| 6,234,379 B1 | 5/2001 | Donges |
| 6,245,213 B1 | 6/2001 | Olsson et al. |
| 6,245,581 B1 | 6/2001 | Bonser et al. |
| 6,274,294 B1 | 8/2001 | Hines |
| 6,309,580 B1 | 10/2001 | Chou |
| 6,326,627 B1 | 12/2001 | Putvinski et al. |
| 6,329,256 B1 | 12/2001 | Ibok |
| 6,334,960 B1 | 1/2002 | Willson et al. |
| 6,383,928 B1 | 5/2002 | Eissa |
| 6,387,783 B1 | 5/2002 | Furukawa et al. |
| 6,388,253 B1 | 5/2002 | Su |
| 6,391,798 B1 | 5/2002 | DeFelice et al. |
| 6,455,411 B1 | 9/2002 | Jiang et al. |
| 6,482,742 B1 | 11/2002 | Chou |
| 6,489,068 B1 | 12/2002 | Kye |
| 6,514,672 B2 | 2/2003 | Young et al. |
| 6,517,977 B2 | 2/2003 | Resnick et al. |
| 6,517,995 B1 | 2/2003 | Jacobenson et al. |
| 6,518,189 B1 | 2/2003 | Chou |
| 6,534,418 B1 | 3/2003 | Plat et al. |
| 6,541,360 B1 | 4/2003 | Plat et al. |
| 6,561,706 B2 | 5/2003 | Singh et al. |
| 6,565,928 B2 | 5/2003 | Sakamoto et al. |
| 6,580,172 B2 | 6/2003 | Mancini et al. |
| 6,632,742 B2 | 10/2003 | Yang et al. |
| 6,635,581 B2 | 10/2003 | Wong |
| 6,646,662 B1 | 11/2003 | Nebashi et al. |
| 6,677,252 B2 | 1/2004 | Marsh |
| 6,696,220 B2 | 2/2004 | Bailey et al. |
| 6,703,190 B2 | 3/2004 | Elian et al. |
| 6,713,238 B1 | 3/2004 | Chou et al. |
| 6,716,767 B2 | 4/2004 | Shih et al. |
| 6,730,256 B1 | 5/2004 | Bloomstein et al. |
| 6,737,202 B2 | 5/2004 | Gehoski et al. |
| 6,743,713 B2 | 6/2004 | Mukherjee-Roy et al. |
| 6,676,983 B2 | 7/2004 | Fujiyama et al. |
| 6,770,852 B1 | 8/2004 | Steger |
| 6,776,094 B1 | 8/2004 | Whitesides et al. |
| 6,777,170 B1 | 8/2004 | Bloomstein et al. |
| 6,809,356 B2 | 10/2004 | Chou |
| 6,828,244 B2 | 12/2004 | Chou |
| 6,873,087 B1 * | 3/2005 | Choi et al. ............. 310/323.17 |
| 2002/0132482 A1 | 9/2001 | Chou |
| 2001/0026714 A1 | 10/2001 | Uezono et al. |
| 2002/0042027 A1 | 4/2002 | Chou et al. |
| 2002/0167117 A1 | 11/2002 | Chou |
| 2002/0177319 A1 | 11/2002 | Chou |
| 2003/0034329 A1 | 2/2003 | Chou |
| 2003/0080471 A1 | 5/2003 | Chou |
| 2003/0081193 A1 | 5/2003 | White et al. |
| 2003/0011368 A1 | 6/2003 | Mancini et al. |
| 2003/0129542 A1 | 7/2003 | Shih et al. |
| 2004/0009673 A1 | 1/2004 | Sreenivasan et al. |
| 2004/0029041 A1 | 2/2004 | Shih et al. |
| 2004/0036201 A1 | 2/2004 | Chou et al. |
| 2004/0046288 A1 | 3/2004 | Chou |
| 2004/0110856 A1 | 6/2004 | Young et al. |
| 2004/0118809 A1 | 6/2004 | Chou et al. |
| 2004/0131718 A1 | 7/2004 | Chou et al. |
| 2004/0137734 A1 | 7/2004 | Chou et al. |
| 2004/0156108 A1 | 8/2004 | Chou et al. |
| 2004/0192041 A1 | 9/2004 | Jeong et al. |
| 2004/0197843 A1 | 10/2004 | Chou et al. |
| 2004/0200411 A1 | 10/2004 | Willson et al. |

FOREIGN PATENT DOCUMENTS

| | | |
|---|---|---|
| JP | 1-196749 | 8/1989 |
| JP | 02-24846 | 1/1990 |
| JP | 02-92603 | 4/1990 |
| WO | WO 92/17883 | 10/1992 |
| WO | WO 98/10121 | 3/1998 |
| WO | WO 99/05724 | 2/1999 |
| WO | WO 99/45753 | 9/1999 |
| WO | WO 99/63535 | 12/1999 |
| WO | WO 00/21689 | 4/2000 |
| WO | WO 01/33232 | 5/2001 |
| WO | WO 01/33300 | 5/2001 |
| WO | WO 01/47003 A2 | 6/2001 |
| WO | WO 01/53889 | 7/2001 |
| WO | WO 01/63361 | 8/2001 |
| WO | WO 01/69317 | 9/2001 |
| WO | WO 01/79589 | 10/2001 |
| WO | WO 01/79591 | 10/2001 |
| WO | WO 01/79592 | 10/2001 |
| WO | WO 01/79933 | 10/2001 |
| WO | WO 01/90816 | 11/2001 |
| WO | WO 02/07199 | 1/2002 |
| WO | WO 03/010289 | 2/2003 |
| WO | WO 03/079416 | 9/2003 |
| WO | WO 03099536 | 12/2003 |
| WO | WO 2004/013693 | 2/2004 |
| WO | WO 2004/016406 | 2/2004 |
| WO | WO 2004/114016 | 12/2004 |

OTHER PUBLICATIONS

Gokan et al., "Dry Etch Resistance of Organic Materials," J. Electrochem. Soc. 130:1, 143–146 (Jan. 1983).

Lin, "Multi–Layer Resist Systems", Introduction of Microlithography, American Chemical Society, 1983, pp. 287–350, IBM T.J. Watson Research Center, Yorktown Heights, New York 10598, no month avail.

Hogan, "Impedance Control: An Approach to Manipulation," Journal of Dynamic Systems, Measurement and Control, Mar. 1985, pp. 1–7, vol. 107.

Cowie,"Polymers: Chemistry and Physics of Modern Materials," 1991, pp. 408–409, $2^{nd}$ Ed. Chapman and Hall, a division of Routledge, Chapman and Hall, Inc., 29 West $35^{th}$ Street, NY, NY 10001–2291, no month avail.

Hollis et al., "A Six–Degree–of–Freedom Magnetically Levitated Variable Compliance Fine Motion Wrist: Design, Modeling and Control," IEEE Transactions on Robotics and Automation, 1991, pp. 320–332, vol. 7, No. 3, no month avail.

Tomita et al., "A 6–Axes Motion Control Method for Parallel–Linkage–Type Fine Motion Stage," Journal of Japan Society of Precision Engineering, 1992, pp. 118–124, no month avail.

Slocum, "Precision Machine Design: Macromachine Design Philosophy and its Applicability to the Design of Micromachines," Micro Electro Mechanical Systems, 1992, pp 37–42, no month avail.

Krug et al., "Fine Patterning of Thin Sol–Gel Films," Journal of Non–Crystalline Solids, 1992, pp. 447–450, vol. 147 & 148, no month avail.

Arai et al., "Calibration and Basic Motion of a Micro Hand Module," Proc. of IEEE, 1993, pp. 1660–1665, no month avail.

Peng et al., "Compliant Motion Control of Kinematically Redundant Manipulators," IEEE Transactions on Robotics and Automation, Dec. 1993, pp. 831–837, vol. 9, No. 6.

Rong et al., "Design and Analysis of Flexure–Hinge Mechanism Used in Micro–Positioning Stages," ASME, PED. vol. 68–2, Manufacturing Science and Engineering, 1994, pp. 979–985, vol. 2, no month avail.

Hashimoto et al, "Design and Characteristics of Parallel Link Compliant Wrist," IEEE International Conference on Robotics and Automation, 1994, pp. 2457–2462, no month avail.

Merlet, "Parallel Manipulators: State of the Art Perspectives," Advanced Robotics, 1994, pp. 589–596, vol. 8, no month avail.

Ananthasuresh et al., "Strategies for Systematic Synthesis of Compliant MEMS," ASME, DSC–vol. 55–2, Dynamic Systems and Control, 1994, pp. 677–686, vol. 2, no month avail.

Kotachi et al., "Si–Containing Positive Resis for ArF Laser Lithography," J. PhotopolymerSci. Tevhnol. 8(4) 615–622, 1995, no month avail.

Krauss et al., "Fabrication of Nanodevices Using Sub–25nm Imprint Lithography," Appl. Phys. Lett 67(21), 3114–3116, 1995, no month avail.

Chou et al., "Imprint of Sub–25 nm Vias and Trenches in Polymers," Applied Physics Letters, Nov. 20, 1995, pp. 3114–3116, vol. 67(21).

Arai et al., "Development of a New Parallel Manipulator with Fixed Linear Actuator," Proc. of Japan/USA Symposium on Flexible Automation, ASME, 1996, pp. 145–149, vol. 1, no month avail.

Chou et al., "Imprint Lithography with 25–Nanometer Resolution," Science, Apr. 5, 1996, pp. 85–87, vol. 272.

Howell et al., "Loop–Closure Theory for the Analysis and Synthesis of Compliant Mechanisms," Journal of Mechanical Design, Mar. 1996, pp. 121–125, vol. 118.

Haisma et al., "Mold–Assisted Nanolithography: A Process for Reliable Pattern Replication," Journal of Vacuum Science and Technology, Nov./Dec. 1996, pp. 4124–4128, vol. B 14(6).

Chou et al., "Imprint Lithography with Sub–10nm Feature Size and High Throughput," Microelectronic Engineering, 1997, pp. 237–240, vol. 35, no month avail.

Pernette et al., "Design of Parallel Robots in Microrobotics," Robotica, Jul.–Aug. 1997, pp. 417–420, vol. 15, No. 4.

Rong et al., "Dynamics of Parallel Mechanism with Direct Compliance Control," IEEE, 1997, pp. 1753–1758, no month avail.

Mittal et al., "Precision Motion Control of Magnetic Suspension Actuator Using a Robust Nonlinear Compensation Scheme," IEEE/ASME Transactions on Mechatronics, Dec. 1997, pp. 268–280, vol. 2, No. 4.

Physik Instrumente, Product Catalog for Micropositioning from www.physikinstrumente.com, 1997, no month avail.

Williams et al., "Six Degree of Freedom Mag–Lev Stage Development," SPIE, 1997, pp. 856–867, vol. 3051, no month avail.

Lee et al., "An Ultraprecision Stage for Alignment of Wafers in Advanced Microlithography," Precision Engineering, 1997, pp. 113–122, vol. 21, Elsevier Science Inc., 655 Avenue of the Americas, NY, NY 10010, no month avail.

Kanetomo et al., "Robot for Use in Ultrahigh Vacuum," Solid State Tech., Aug. 1997, pp. 63–64, 69–72.

Goldfarb et al., "Compliant Micromanipulator Design for Scaled Bilateral Telemanipulation of Small–Scale Environments," Proc. of the ASME, Dynamic Systems and Control Div., 1998, pp. 213–218, vol. 64, no month avail.

Koseki et al., "Design and Accuracy Evalulation of High–Speed and High–Precision Parallel Mechanism," Proc. of the 1998 IEEE, Intl. Conf. on Robotics & Automation, May 1998, pp. 1340–1345, Leuven, Belgium.

Kim et al., "High Precision Magnetic Levitation Stage for Photolithography," Precision Engineering, 1998, pp. 66–77, vol. 22, Elsevier Science Inc., 655 Avenue of the Americas, NY, NY 10010, no month avail.

Mansky et al., "Large–Area Domain Alignment in Block Copolymer Thin Films Using Electric Fields," Macromolecules, 1998, pp. 4399–4401, vol. 31, no month avail.

Wang et al., "Passive Compliance Versus Active Compliance in Robot–Based Automated Assembly Systems," Industrial Robot, 1998, pp. 48–57, vol. 25, No. 1, MCB University Press, no month avail.

Scheer et al., "Problems of the Nanoimprinting Technique for Nanometer Scale Pattern Definition," Journal of Vacuum Science and Technology, Nov./Dec. 1998, pp. 3917–3921, vol. B 16(6).

Xia et al., "Soft Lithography," Annu. Rev. Mater. Sci., 1998, pp. 153–184, vol. 28, no month avail.

Xia et al., "Soft Lithography," Agnew. Chem. Int. Ed., 1998, pp. 560–575, vol. 37, no month avail.

Tajbakhsh et al., "Three–Degree–of–Freedom Optic Mount for Extreme Ultraviolet Lithography," ASPE, 1998, pp. 359–362, vol. 18, no month avail.

Lee et al., "Ultra Precision Positioning System for Servo Motor–Plazo Actuator Using the Dual Servo Loop and Digital Filter Implementation," ASPE, 1998, pp. 287–290, vol. 18, no month avail.

Wu et al., "Large Area High Density Quantized Magnetic Disks Fabricated Using Nanoimprint Lithography," Journal of Vacuum Science and Technology, Nov./Dec. 1998, pp. 3825–3829, vol. B 16(6).

Ohya et al., "Development of 3–DOF Finger Module for Micro Manipulation," Proc. of the 1999 IEEE/RSJ, Intl. Conf. on Intelligent Robots and Systems, 1999, pp. 894–899, no month avail.

Tanikawa et al., "Development of Small–Sized 3 DOF Finger Moldule in Micro Hand for Micro Manipulation," Proc. of the IEEE/RSJ. Intl. Conf. on Intelligent Robots and Systems, 1999, pp. 876–881, no month avail.

Colburn et al., "Step and Flash Imprint Lithography: A New Approach to High–Resolution Patterning", Proc. of SPIE, 1999, pp. 379–389, vol. 3676, no month avail.

Lucas Aerospace, Free–Flex Pivot Catalog, 1999, no month avail.

Goldfarb et al., "A Well–Behaved Revolute Flexure Joint for Compliant Mechanism Design," Journal of Mach. Design, Sep. 1999, pp. 424–429, vol. 121.

Geodetic Technology, G1000–PC Power Series Specifications, 1999, from www.hexapods.com, no month avail.

Hexel Corporation, Tornado 2000 System Specifications, 1999, from www.Hexel.com, no month avail.

Physik Instruments, PI Online–Catalog, 1999, from www.Physikinstruments.com, no month avail.

Chou et al., "Lithographically–Induced Self Assembly of Periodic Polymer Micropillar Arrays," Journal of Vacuum Science and Technology, Nov./Dec. 1999, pp. 3197–3202, vol. B 17(6).

Ruchhoeft et al., "Patterning Curved Surfaces: Template Generation by Ion Beam Proximity Lithography and Relief Transfer by Step and Flash Imprint Lithography," Journal of Vacuum Science and Technology, 1999, pp 2985–2982, vol. 17, no month avail.

Vanderbilt University Office of Transfer Technology, VU 9730 Specifications for Improved Flexure Device; 2001, from www.vanderbilt.com, no month avail.

Stix, "Getting More from Moore's," Scientific American, 2001, from www.scientificamerican.com, no month avail.

Choi et al., "High Precision Orientation Alignment and Gap Control Stages for Imprint Lithography Processes," U.S. Appl. No. 09/698,317, filed with USPTO on Oct. 27, 2000.

Sreenivasan et al., "High–Resolution Overlay Alignment Methods and Systems for Imprint Lithography," U.S. Appl. No. 09/907,512, filed with USPTO on Jul. 16, 2001.

Choi et al., "Method and System of Automatic Fluid Dispensing for Imprint Lithography Processes," U.S. Appl. No. 09/908,455, filed with USPTO on Jul. 17, 2001.

Willson et al., "Step and Flash Imprint Lithography," U.S. Appl. No. 09/908,765, filed with USPTO on Jul. 19, 2001.

Choi et al., "Methods for High–Precision Gap and Orientation Sensing Between a Transparent Template and Substrate for Imprint Lithography," U.S. Appl. No. 09/920,341, filed with USPTO on Aug. 1, 2001.

Nguyen, A. Q., "Asymmetric Fluid–Structure Dynamics in Nanoscale Imprint Lithography," University of Texas at Austin, Aug. 2001.

Choi et al., "Flexure Based Macro Motion Translation Stage," U.S. Appl. No. 09/934,248, filed with USPTO on Aug. 21, 2001.

Bailey et al., "Template for Room Temperature Low Pressure Micro– and Nano–Imprint Lithography," U.S. Appl. No. 09/976,681, filed with USPTO on Oct. 12, 2001.

Watts et al., "Low Viscosity High Resolution Patterning Material," U.S. Appl. No. 10/178,947, filed with USPTO on Jun. 24, 2002.

Abstract of Japanese Patent 63–138730. No date available.
Abstract of Japanese Patent 55–88332. No date available.
Abstract of Japanese Patent 57–7931. No date available.
Abstract of Japanese Patent 02–92603. No date available.
Translation of Japanese Patent 02–92603. No date available.
Abstract of Japanese Patent 02–24848. No date available.
Translation of Japanese Patent 02–24848. No date available.

Heidari et al., "Nanoimprint Lithography at the 6 in Wafer Scale," Journal of Vacuum Science Technology, Nov./Dec. 2000, pp. 3557–3560, vol. B, No. 18(6).

Nerac.com Retro Search, "Reduction of Dimension of Contact Holes", Aug. 31, 2004. No page numbers.

Nerac.com Retro Search, "Trim Etching of Features Formed on an Organic Layer", Sep. 2, 2004. No page numbers.

Nerac.com Retro Search, "Multi–Layer Resists", Sep. 2, 2004. No page numbers.

Hu et al., "Flourescence Probe Techniques (FPT) for Measuring the Relative Efficiences of Free–Radical Photoinitiators", s0024–9297(97)01390–9; "Macromolecules"1998, vol. 31, No. 13, pp. 4107–4113, 1998 American Chemical Society. Published on Web May 29, 1998.

Feynman, Richard P., "There's Plenty of Room at the Bottom—An Invitation to Enter a New Field of Physics," 12 pp [online ]Retrieved Sep. 23, 2004 from URI:http://www.zyvex.com/nanotech/feynman.html.

Communication Relating to the Results of the Partial International Search; International Appl. No. PCT/US2002/015551.

U.S. Appl. No. 10/687,562, Cherla et al., filed Nov. 16, 2003.

U.S. Appl. No. 10/923,629, Sreenivasan et al., filed Aug. 20, 2004.

Chou, Nanoimprint Lithography and Lithographically Induced Self–Assembly, MRS Bulletin, pp. 512–517, Jul. 1, 2001.

Choi et al., Design of Orientation Stages for Step and Flash Imprint Lithography, Precision Engineering, pp. 192–199, Jan. 1, 2001.

Colburn et al., Step and Flash Imprint Lithography for sub–100 nm Patterning, Proceedings of SPIE vol. 1997, pp. 453–457, Jan. 1, 2000.

Johnson et al., Advances in Step and Flash Imprint Lithography, SPIE Microlithography Conference, Feb. 23, 2003. No. page numbers.

Chou et al., Ultrafast and Direct Imprint of Nanostructures in Silicon, Nature, Col. 417, (Jun. 2002), pp. 835–837, Jun. 1, 2002.

Chou et al., Nanoimprint Lithography, Journal of Vacuum Science Technology B 14(16), pp. 4129–4133, Nov. 1, 1996.

Colburn et al., Development and Advantages of Step–and–Flash Lithography, Solid State Technology, Jul. 1, 2001. No page numbers.

Colburn et al., Characterization and Modeling of Volumetric and Mechanical Properties for Step and Flash Imprint Lithography Photopolymers, Journal of Vacuum Science Technology, vol. b. 19(6), Nov. 1, 2001. No. page numbers.

Bailey et al., Step and Flash Imprint Lithography: Defect Analysis, Journal of Vacuum Science, B 19(6), pp. 2806–2810, Nov. 1, 2001.

Bailey et al., Step and Flash Imprint Lithography: Template Surface Treatment and Defect Analysis, Journal of Vacuum Science, B 18(6), pp. 3572–3577, Nov. 1, 2000.

Schneider et al., Stripes of Partially Fluorinated Alkyl Chains: Dipolar Langmuir Monolayers. No date available + no page numbers.

* cited by examiner

METHOD FOR FABRICATING NANOSCALE PATTERNS IN LIGHT CURABLE COMPOSITIONS USING AN ELECTRIC FIELD

BACKGROUND OF THE INVENTION

1. Field of the Invention

This invention generally relates to the area of low cost, high-resolution, high-throughput lithography with the potential to make structures that are below 100 nm in size.

2. Description of the Relevant Art

Optical lithography techniques are currently used to make microelectronic devices. However, these methods are reaching their limits in resolution. Sub-micron scale lithography has been a critical process in the microelectronics industry. The use of sub-micron scale lithography allows manufacturers to meet the increased demand for smaller and more densely packed electronic components on chips. The finest structures producible in the microelectronics industry are currently on the order of about 0.13 µm. It is expected that in the coming years, the microelectronics industry will pursue structures that are smaller than 0.05 µm (50 nm). Further, there are emerging applications of nanometer scale lithography in the areas of opto-electronics and magnetic storage. For example, photonic crystals and high-density patterned magnetic memory of the order of terabytes per square inch require nanometer scale lithography.

For making sub-50 nm structures, optical lithography techniques may require the use of very short wavelengths of light (for instance 13.2 nm). At these short wavelengths, few, if any, materials are optically transparent and therefore imaging systems typically have to be constructed using complicated reflective optics [1]. Furthermore, obtaining a light source that has sufficient output intensity at these wavelengths of light is difficult. Such systems lead to extremely complicated equipment and processes that appear to be prohibitively expensive. High-resolution e-beam lithography techniques, though very precise, typically are too slow for high-volume commercial applications.

One of the main challenges with current imprint lithography technologies is the need to establish direct contact between the template (master) and the substrate. This may lead to defects, low process yields, and low template life. Additionally, the template in imprint lithography typically is the same size as the eventual structures on the substrate (1X), as compared to 4X masks typically used in optical lithography. The cost of preparing the template and the life of the template are issues that may make imprint lithography impractical. Hence there exists a need for improved lithography techniques that address the challenges associated with optical lithography, e-beam lithography and imprint lithography for creating very high-resolution features.

SUMMARY OF THE INVENTION

In one embodiment, patterned structures may be created on a substrate using imprint lithography. The process involves applying a polymerizable composition to the upper surface of the substrate. The substrate may be a substrate used to prepare a semiconductor device. Examples of substrates include, but are not limited to, Si wafers, GaAs wafers, SiGeC wafers, or an InP wafers. The polymerizable composition may be an ultraviolet light curable composition. The ultraviolet light curable composition may include a polymerizable monomer and a photo initiator. The composition may be spin coated onto the substrate.

After the substrate has been coated with the polymerizable composition a template may be placed above the polymerizable composition. The template is formed from an electrically conductive material. The template may also be substantially transparent to visible and/or ultraviolet light. The template may be formed of a combination of an electrically conductive material coupled to a non-conductive material. Both the electrically conductive material and the non-conductive material may be substantially transparent to light. In one embodiment, the template may be formed of indium tin oxide and fused silica. The template includes a pattern of structures. The pattern of structures are complimentary to the pattern of structures which are to be produced on the substrate. At least a portion of the structures may have a feature size of less than about 100 nm.

An electric field may be applied between the template and the substrate. The application of the electric field may create a static force that attracts at least a portion of the polymerizable composition toward the template. The portions of the polymerizable composition that are attracted to the template are complementary to the pattern of structures imprinted on the template. In one embodiment, the portions of the polymerizable composition that are attracted to the template come into contact with the template, while the remaining portions do not contact the template. Alternatively, neither the attracted portions nor the remaining portions of the polymerizable composition come into contact with the template. The attracted portions, however, extend toward the template while the unattracted portions do not extend to the same extent that the attracted portions extend toward the template.

The polymerizable composition may be polymerized using an appropriate curing technique. For example, the polymerizable composition may include a photoinitiator and be curable by exposure to activating light while an electric field is applied to the template and the substrate. As used herein "activating light" means light that may affect a chemical change. Activating light may include ultraviolet light (e.g., light having a wavelength between about 300 nm to about 400 nm), actinic light, visible light or infrared light. Generally, any wavelength of light capable of affecting a chemical change may be classified as activating. Chemical changes may be manifested in a number of forms. A chemical change may include, but is not limited to, any chemical reaction that causes a polymerization or a cross-linking reaction to take place. The activating light may be passed through the template prior to reaching the composition. In this manner the polymerizable composition may be cured to form structures complementary to the structures formed on the template. Alternatively, the polymerizable composition may be cured by applying heat to the composition, while an electric field is applied to the template and the substrate.

After the polymerizable composition is cured, the structures may be further defined by etching the cured polymerizable composition. Etching may improve the aspect ratio of the structures. Any of the commonly used etching techniques may be used, including reactive ion etching.

In one embodiment, the template may be positioned less than about 1 µm from the polymerizable composition. The substrate should therefore have a planarity of less than about 1 µm, preferable less than about 0.25 µm. As used herein planarity is defined as the variance in curvature over the surface of the substrate. For example, a planarity of 1 µm indicates that the curvature of the surface varies by 1 µm above and/or below a center point which defines a planar surface.

To achieve a surface having a planarity of less than about 1 µm, the substrate may be placed on an apparatus configured to alter the shape of the substrate. The apparatus may include a holder configured to couple to and support the substrate. The apparatus may also include a plurality of pressure application devices coupled to the holder. The pressure application devices may be configured to apply a deforming force to the holder such that the shape of the holder is altered. The substrate may be coupled to the holder such that the changes in the shape of the holder may be imparted to the substrate. In this manner, the planarity of the substrate may be altered to conform to the desired planarity. The apparatus may include a programmable controller. The programmable controller may include a detection device configured to determine the planarity of the substrate. The controller may further be configured to operate the pressure application devices to alter the planarity of the substrate based on the determined planarity.

DETAILED DESCRIPTION OF THE INVENTION

Figure 1A:
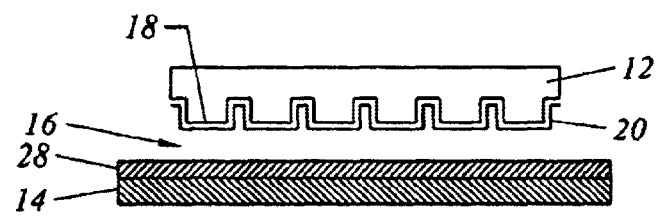
FIGS. 1A-1E illustrate a version of the imprint lithography process according to the invention.
Figure 1B:
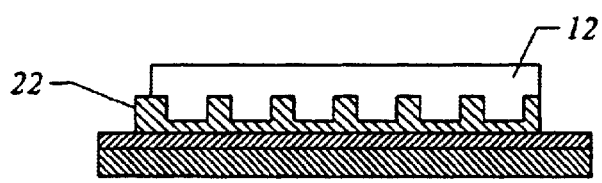

FIGS. 1A thru 1E illustrate an imprint lithography process according to the invention, denoted generally as 10. In FIG. 1A, a template 12 is orientated in spaced relation to a substrate 14 so that a gap 16 is formed in the space separating template 12 and substrate 14. A surface 18 of template 12 is treated with a thin layer 20 that lowers the template surface energy and assists in separation of template 12 from substrate 14. The manner of orientation including devices for controlling of gap 16 between template 12 and substrate 14 are discussed below. Next, in FIG. 1B, gap 16 is filled with a substance 22 that conforms to the shape of surface 18. Preferably, substance 22 is a liquid so that it fills the space of gap 16 rather easily without the use of high temperatures and gap 16 can be closed without requiring high pressures.

Figure 1C:
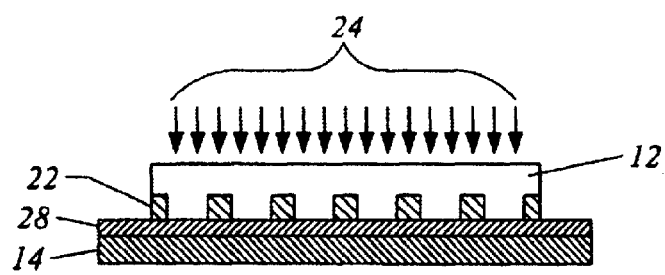

A curing agent 24, shown in FIG. 1C, is applied to template 12 causing substance 22 to harden and assume the shape of the space defined by gap 16 between template 12 and substrate 14. In this way, desired features 26, shown in FIG. 1D, from template 12 are transferred to the upper surface of substrate 14. A transfer layer 28 is provided directly on the upper surface of substrate 14 which facilitates the amplification of features transferred from template 12 onto substrate 14 to generate high aspect ratio features.

Figure 1D:
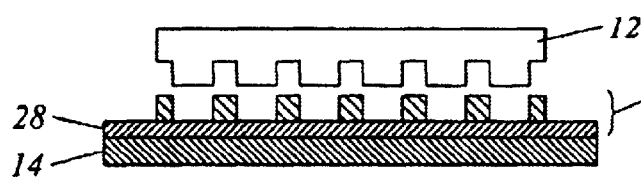

In FIG. 1D, template 12 is removed from substrate 14 leaving the desired features 26 thereon. The separation of template 12 from substrate 14 must be done so that desired features 26 remain intact without shearing or tearing from the surface of substrate 14.

Figure 1E:
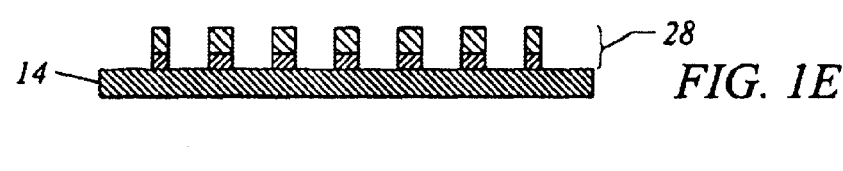
Figure 2:
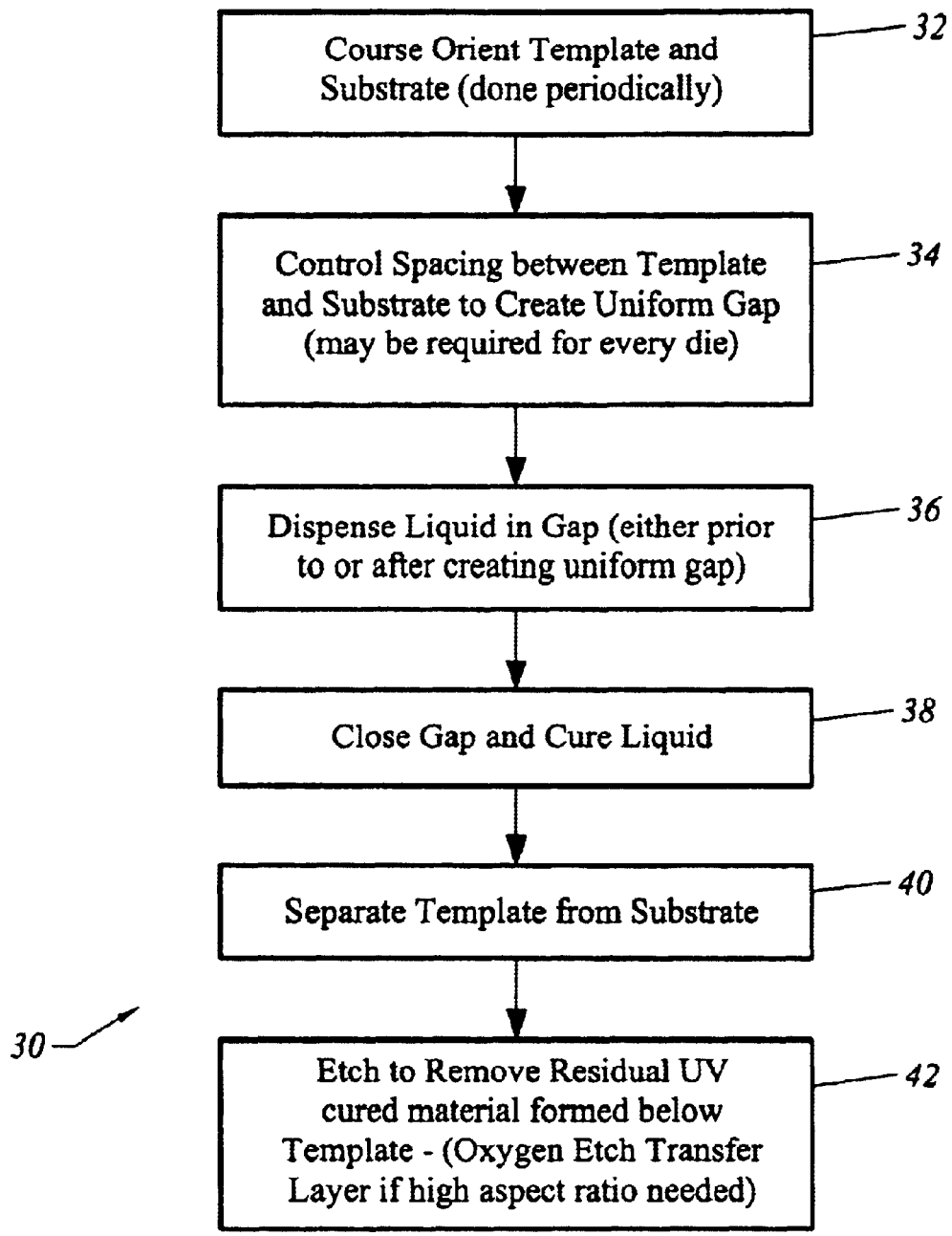
FIG. 2 is a process flow diagram showing the sequence of steps of the imprint lithography process of FIGS. 1A-1E.

Finally, in FIG. 1E, features 26 transferred from template 12, shown in FIG. 1D, to substrate 14 are amplified in vertical size by the action of transfer layer 28, as is known in the use of bi-layer resist processes. The resulting structure can be further processed to complete the manufacturing process using well-known techniques. FIG. 2 summarizes the imprint lithography process, denoted generally as 30, of the present invention in flow chart form. Initially, at step 32, course orientation of a template and a substrate is performed so that a rough alignment of the template and substrate is achieved. The advantage of course orientation at step 32 is that it allows pre-calibration in a manufacturing environment where numerous devices are to be manufactured with efficiency and with high production yields. For example, where the substrate comprises one of many die on a semiconductor wafer, course alignment (step 32) can be performed once on the first die and applied to all other dies during a single production run. In this way, production cycle times are reduced and yields are,increased.

Next, at step 34, the spacing between the template and substrate is controlled so that a relatively uniform gap is created between the two layers permitting the type of precise orientation required for successful imprinting. The present invention provides a device and system for achieving the type of orientation (both course and fine) required at step 34. At step 36, a liquid is dispensed into the gap between the template and substrate. Preferably, the liquid is a UV curable organosilicon solution or other organic liquids that become a solid when exposed to UV light. The fact that a liquid is used eliminates the need for high temperatures and high pressures associated with prior art lithography techniques.

At step 38, the gap is closed with fine orientation of the template about the substrate and the liquid is cured resulting in a hardening of the liquid into a form having the features of the template. Next, the template is separated from the substrate, step 40, resulting in features from the template being imprinted or transferred onto the substrate. Finally, the structure is etched, step 42, using a preliminary etch to remove residual material and a well-known oxygen etching technique to etch the transfer layer.

As mentioned above, recent imprint lithography techniques with UV curable liquids [2, 3, 4, 5] and polymers [6] have been described for preparing nanoscale structures. These techniques may potentially be significantly lower cost than optical lithography techniques for sub-50 nm resolution. Recent research [7, 8] has also investigated the possibility of applying electric fields and van der Waals attractions between a template that possesses a topography and a substrate that contains a polymeric material to form nanoscale structures. This research has been for systems of polymeric material that may be heated to temperatures that are slightly above their glass transition temperature. These viscous polymeric materials tend to react very slowly to the electric fields (order of several minutes) making them less desirable for commercial applications.

The embodiments described herein may potentially create lithographic patterned structures quickly (in a time of less than about 1 second). The structures may have sizes of tens of nanometers. The structures may be created by curing a polymerizable composition (e.g., a spin-coated UV curable liquid) in the presence of electric fields. Curing the polymerizable composition then sets the pattern of structures on the substrate. The pattern may be created by placing a template with a specific nanometer-scale topography at a carefully controlled nanoscale distance from the surface of a thin layer of the liquid on a substrate. If all or a portion of the desired structures are regularly repeating patterns (such as an array of dots), the pattern on the template may be considerably larger than the size of the desired repeating structures. The template may be formed using direct write e-beam lithography. The template may be used repeatedly in a high-throughput process to replicate nanostructures onto substrates. In one embodiment, the template may be fabricated from a conducting material such as Indium Tin Oxide that is also transparent to UV light. The template fabrication process is similar to that of phase shift photomasks for optical lithography; phase shift masks require an etch step that creates a topography on the template.

Figure 4:
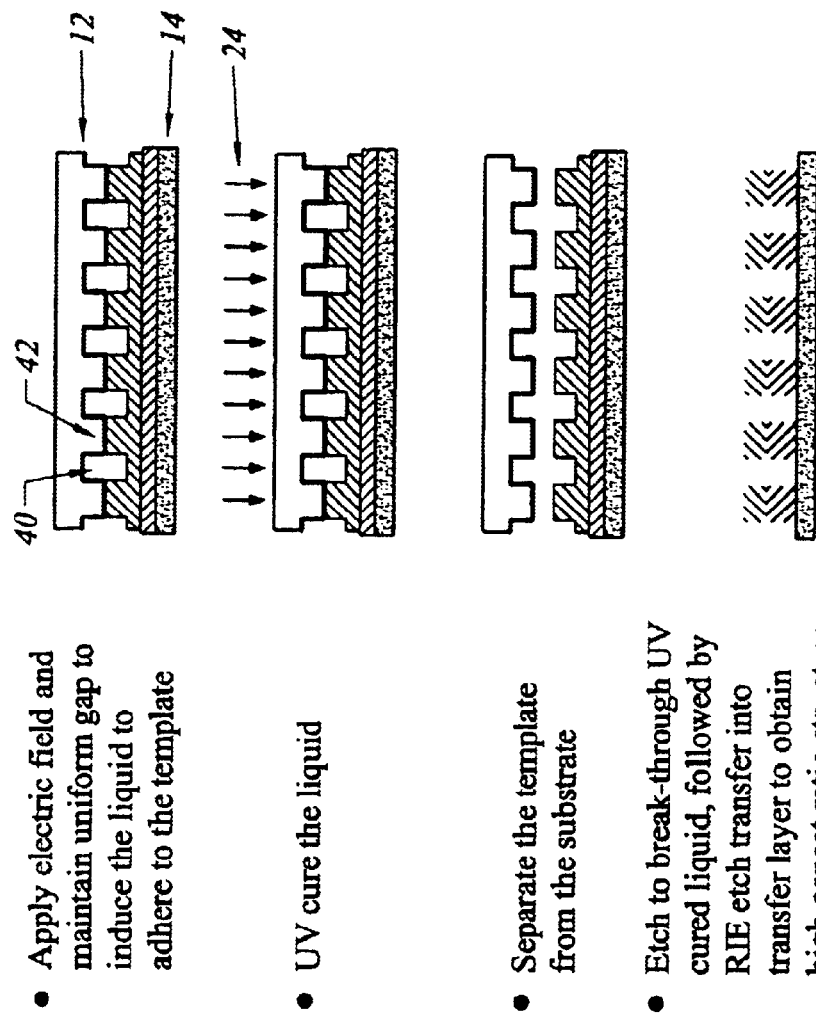
FIG. 4 is a side view of a process for forming nanoscale structures using direct contact with a template.

Referring to FIG. 4, the replication of the pattern on the template may be achieved by applying an electric field between the template and the substrate. Because the liquid and air (or vacuum) have different dielectric constants and the electric field varies locally due to the presence of the topography of the template, an electrostatic force may be generated that attracts regions of the liquid toward the template. As a result of entailing local variations, the electric field comprises a plurality of sub-electric fields defined therein, however, only a first and a second sub-electric field are herein described and are hereinafter referred to as a first and a second electric field. The magnitudes of the first and second electric fields are a function of the distance defined between the template and the substrate. More specifically, the first electric field may be associated with recess 40, wherein the magnitude of the first electric field is a function of the distance defined between recess 40 and substrate 14. The second electric field may be associated with protrusion 42, wherein the magnitude of the second electric field is a function of the distance defined between protrusion 42 and substrate 14. To that end, as a result of the distance defined between recess 40 and substrate 14 being greater than the distance defined between protrusion 42 and substrate 14, the magnitude of the first electric field is greater than the magnitude of the second electric field. Also, as a result of having the first electric field associated with recess 40 and the second electric field associated with protrusion 42, the first and the second electric fields are disposed adjacent one another. To that end, the differing magnitudes associated with the first and second electric fields define electric field gradients between the same. Also, as mentioned above, the first and second electric fields are associated with recess 40 and protrusion 42, respectively. However, template 12 comprises a plurality of protrusions and recesses. To that end, each protrusion and recess of template 12 has an electric field associated therewith, wherein each electric field associated with each protrusion and recess of template 12 is defined in the same manner as described above with respect to the first and second electric fields. To that end, template 12 comprises a plurality of electric field gradients defined between adjacent differing electric fields, and more specifically, template 12 comprises a plurality of electric field gradients defined between regions of template 12 wherein the distance between template 12 and substrate 14 changes in magnitude. At high electric field strengths, the polymerizable composition may be made to attach to the template and dewet from the substrate at certain points. This polymerizable composition may be hardened in place by polymerization of the composition. The template may be treated with a low energy self-assembled monolayer film (e.g., a fluorinated surfactant) to aid in detachment of the template the polymerized composition.

It may be possible to control the electric field, the design of the topography of the template and the proximity of the template to the liquid surface so as to create a pattern in the polymerizable composition that does not come into contact with the surface of the template. This technique may eliminate the need for mechanical separation of the template from the polymerized composition. This technique may also eliminate a potential source of defects in the pattern. In the absence of contact, however, the liquid may not form sharp, high-resolution structures that are as well defined as in the case of contact. This may be addressed by first creating structures in the polymerizable composition that are partially defined at a given electric field. Subsequently, the gap may be increased between the template and substrate while simultaneously increasing the magnitude of the electric field to "drawout" the liquid to form clearly defined structures without requiring contact.

The polymerizable composition may be deposited on top of a hard-baked resist material to lead to a bi-layer process. Such a bi-layer process allows for the formation of low aspect ratio, high-resolution structures using the electrical fields followed by an anisotropic etch that results in high-aspect ratio, high-resolution structures. Such a bi-layer process may also be used to perform a "metal lift-off process" to deposit a metal on the substrate such that the metal is left behind after lift-off in the trench areas of the originally created structures.

By using a low viscosity polymerizable composition, the pattern formation due to the electric field may be fast (e.g., less than about 1 sec.), and the structure may be rapidly cured. Avoiding temperature variations in the substrate and the polymerizable composition may also avoid undesirable pattern distortion that makes nano-resolution layer-to-layer alignment impractical. In addition, as mentioned above, it is possible to quickly form a pattern without contact with the template, thus eliminating defects associated with imprint methods that require direct contact.

Figure 3:
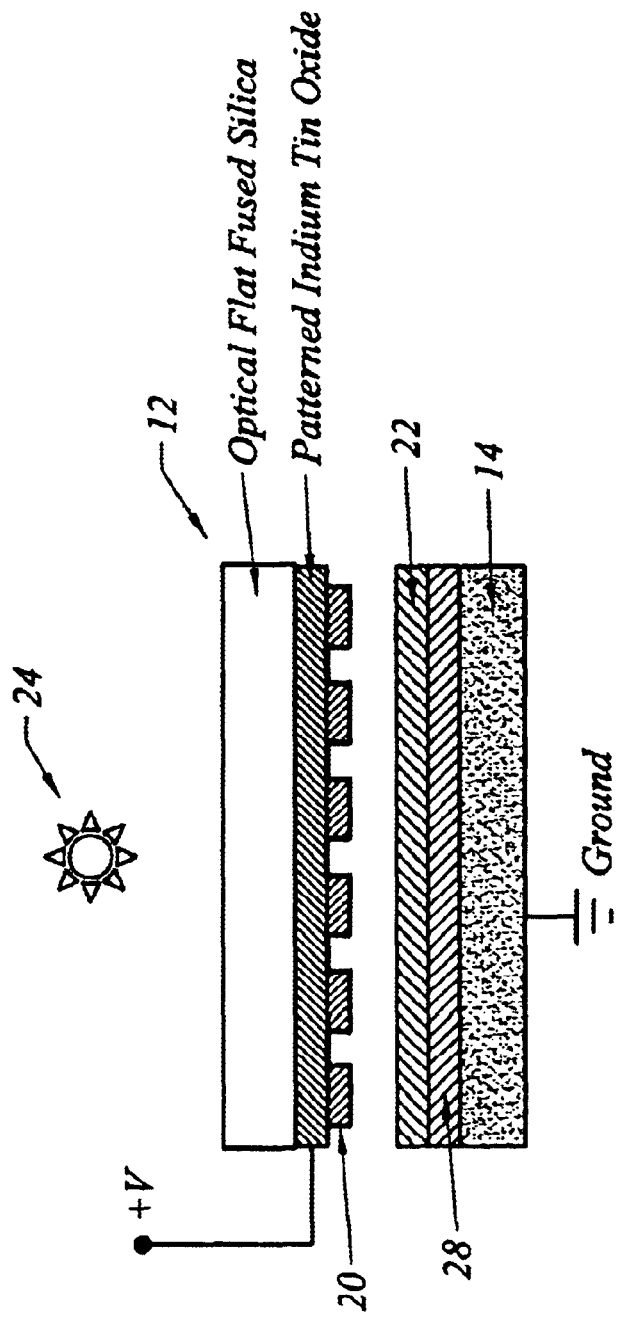
FIG. 3 is a side view of a template positioned over a substrate for electric field based lithography.

FIG. 3 depicts an embodiment of the template and the substrate designs. Template 12 may be formed from a material that is transparent to activating light produced by curing agent 24 to allow curing of substance 22, with substance 22 being a polymerizable composition, by exposure to activating light. Forming template 12 from a transparent material may also allow the use of established optical techniques to measure gap 16 between template 12 and substrate 14 and to measure overlay marks to perform overlay alignment and magnification correction during formation of the structures. Template 12 may also be thermally and mechanically stable to provide nano-resolution patterning capability. Template 12 may also include an electrically conducting material to allow electric fields to be generated at the template-substrate interface.

In one embodiment, depicted in FIG. 3, a thick blank of fused silica has been chosen as the base material for template 12. Indium Tin Oxide (ITO) may be deposited onto the fused Silica. ITO is transparent to visible and UV light and is a conducting material. ITO may be patterned using high-resolution e-beam lithography. Thin layer 20 (for example, a fluorine containing self-assembly monolayer) may be coated onto template 12 to improve the release characteristics between template 12 and substance 22. Substrate 14 may include standard wafer materials such as Si, GaAs, SiGeC and InP. A UV curable liquid may be used as substance 22. Substance 22 may be spin coated onto substrate 14. An optional transfer layer 28 may be placed between substrate 14 and transfer layer 28. Transfer layer 28 may be used for bi-layer process. Transfer layer 28 material properties and thickness may be chosen to allow for the creation of high-aspect ratio structures from low-aspect ratio structures created in substance 22. An electric field may be generated between template 12 and substrate 14 by connecting the ITO to a voltage source.

Figure 5:
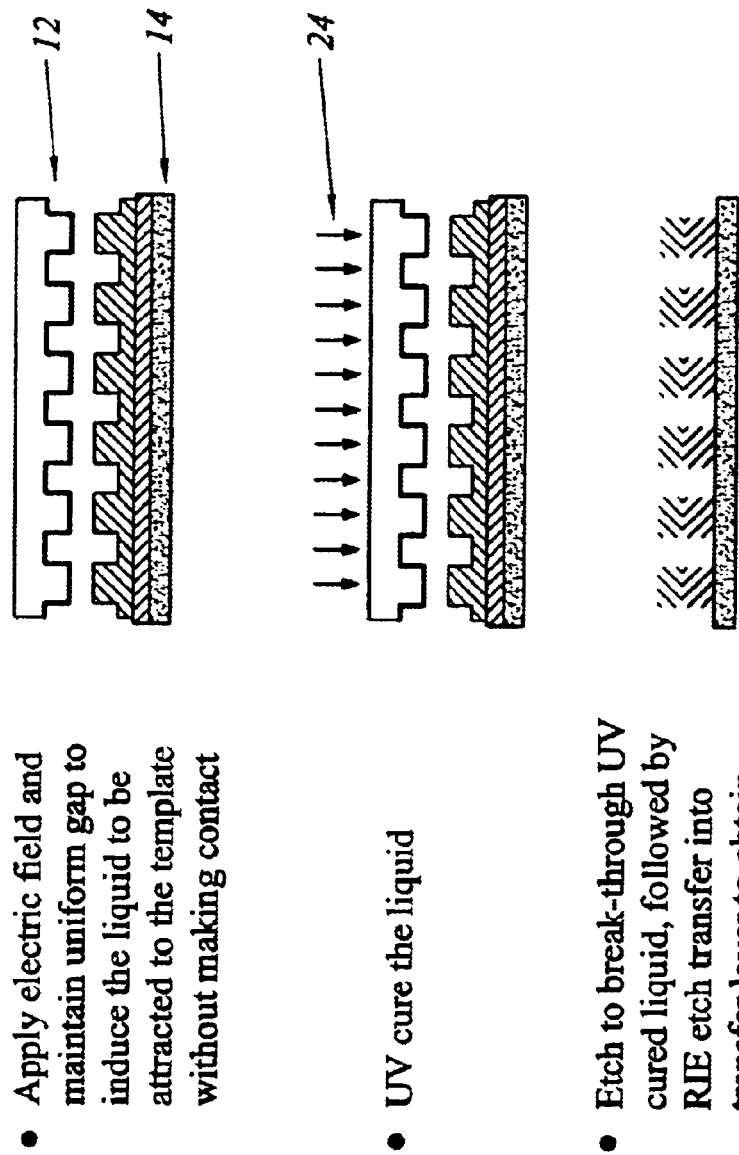
FIG. 5 is a side view of a process for forming nanoscale structures using non-direct contact with a template.

In FIGS. 4 and 5, two variants of the above-described process are presented. In each variant, it is assumed that a desired uniform gap 16 may be maintained between template 12 and substrate 14. An electric field of the desired magnitude may be applied resulting in the attraction of substance 22 towards the raised portions of template 12, and in a particular example, substance 22 may be raised towards protrusion 42 of template 12 forming a contiguous region of substance 22 between two spaced-apart electric field gradients. In FIG. 4, gap 16 and the field magnitudes are such that substance 22 makes direct contact and adheres to template 12. A UV curing process may be used to harden substance 22 in that configuration. Once the structures have been formed, template 12 is separated from substrate 14 by either increasing gap 16 till the separation is achieved, or by initiating a peel and pull motion wherein template 12 is peeled away from substrate 14 starting at one edge of template 12. Prior to its use, template 12 is assumed to be treated with thin layer 20 that assists in the separation step.

In FIG. 5, gap 16 and the field magnitudes are chosen such that substance 22 achieves a topography that is essentially the same as that of template 12. This topography may be achieved without making direct contact with template 12. A UV curing process may be used to harden substance 22 in that configuration. In both the processes of FIGS. 4 and 5, a subsequent etch process may be used to eliminate the residual layer of the UV cured material. A further etch may also be used if transfer layer 28 is present between substance 22 and substrate 14 as shown in FIGS. 4 and 5. As mentioned earlier, transfer layer 28 may be used to obtain high-aspect ratio structures from a low aspect ratio structure created in substance 22.

Figure 6:
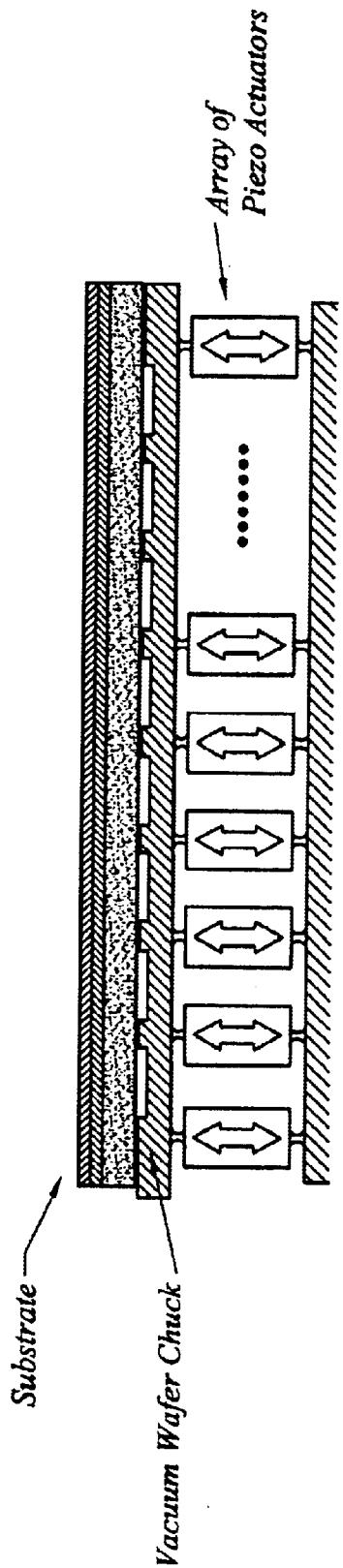
FIG. 6 is a side view of a substrate holder configured to alter the planarity of the substrate.

FIG. 6 illustrates mechanical devices that may increase the planarity of the substrate. The template may be formed from high-quality optical flats of fused-silica with Indium Tin Oxide deposited on the fused silica. Therefore, the template typically possess extremely high planarity. The substrates typically have low planarity. Sources of variations in the planarity of the substrate include poor finishing of the back side of the wafer, the presence of particular contaminants trapped between the wafer and the wafer chuck, and wafer distortions caused by thermal processing of the wafer. In one embodiment, the substrate may be mounted on a chuck whose top surface shape may be altered by a large array of piezoelectric actuators. The chuck thickness may be such that accurate corrections in surface topography of up to a few microns may be achieved. The substrate may be mounted to the chuck such that it substantially conforms to the shape of the chuck. Once the substrate is loaded on to the chuck, a sensing system (e.g., an optical surface topography measurement system) may be used to map the top surface of the substrate accurately. Once the surface topology is known, the array of piezoelectric actuators may be actuated to rectify the topography variations such that the upper surface of the substrate exhibits a planarity of less than about 1 $\mu$m. Since the template is assumed to be made from an optically flat material, this leads to template and substrate that are high quality planar surfaces.

Figure 7:
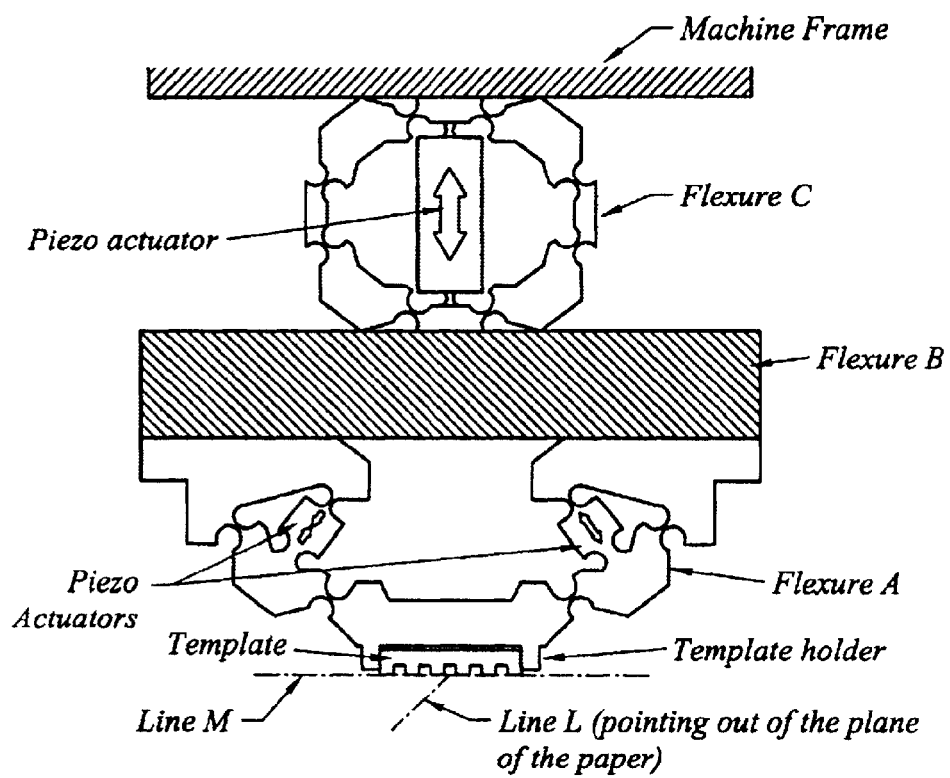
FIG. 7 is a side view of an apparatus for positioning a template over a substrate.

The mechanical device in FIG. 7 may be used to perform a high-resolution gap control at the template-substrate interface. This device may control two tilting degrees of freedom (about orthogonal axes that lie on the surface of the template) and the vertical translation degree of freedom of the template. The magnitude of the gap between the template and the substrate may be measured in real-time. These real-time measurements may be used to identify the corrective template motions required about the tilting degrees of freedom and the vertical displacement degree of freedom. The three gap measurements may be obtained by using a broadband optical interferometric approach that is similar to the one used for measuring thicknesses of thin films and thin film stacks. This approach of capacitive sensing may also be used for measuring these three gaps.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

REFERENCES

The following references are specifically incorporated herein by reference
1. "Getting More from Moore's," Gary Stix, Scientific American, April 2001.
2. "Step and Flash Imprint Lithography: An alternative approach to high resolution patterning," M. Colburn, S. Johnson, M. Stewart, S. Damle, B. J. Choi, T. Bailey, M. Wedlake, T. Michaelson, S. V. Sreenivasan, J. Ekerdt, C. G. Willson, Proc. SPIE Vol.3676, 379–389,1999.
3. "Design of Orientation Stages for Step and Flash Imprint Lithography," B. J. Choi, S. Johnson, M. Colburn, S. V. Sreenivasan, C. G. Willson, To appear in J. of Precision Engineering.
4. U.S. patent application Ser. No. 09/266,663 entitled "Step and Flash Imprint Lithography" to Grant Willson and Matt Colburn.
5. U.S. patent application Ser. No. 09/698,317 entitled "High Precision Orientation Alignment and Gap Control Stages for Imprint Lithography Processes" to B. J. Choi, S. V. Sreenivasan and Steve Johnson.
6. "Large area high density quantized magnetic disks fabricated using nanoimprint lithography," W. Wu, B. Cui, X. Y. Sun, W. Zhang, L. Zhunag, and S. Y. Chou., J. Vac Sci Technol B 16 (6) 3825–3829 Nov–Dec 1998
7. "Lithographically-induced Self-assembly of Periodic Polymer Micropillar Arrays," S. Y. Chou, L. Zhuang, J Vac Sci Tech B 17 (6), 3197–3202, 1999
8. "Large Area Domain Alignment in Block Copolymer Thin Films Using Electric Fields," P. Mansky, 1. DeRouchey, J. Mays, M. Pitsikalis, T. Morkved, H. Jaeger and T. Russell, Macromolecules 13,4399 (1998).

What is claimed is:

1. A method of creating a pattern on a body, said method comprising:

arranging a liquid to be between a template and said body;

orienting said template proximate to said liquid; and moving a portion of said liquid between said template and said body to form a contiguous region of said liquid between two spaced-apart electric field gradients, with each of said electric field gradients being defined by first and second electric fields, with said first electric field being adjacent to said second electric field and said first electric field being greater than said second electric field.

2. The method as recited in claim 1, wherein said pattern comprises a topology selected from a group of topologies consisting essentially of recessed and protruded, smooth, and planarized.

3. The method as recited in claim 1, wherein moving said portion of said liquid further includes moving said portion away from said body, toward said template.

4. The method as recited in claim 1, further includes solidifying said liquid.

5. The method as recited in claim 4, wherein solidifying further includes solidifying said liquid in the presence of said first and second electric fields.

6. The method as recited in claim 1, wherein said template further includes a surface facing said body and moving paid portion of said liquid further includes applying said first, and second electric fields to said surface.

7. The method as recited in claim 1, wherein arranging said liquid further includes arranging a low viscosity liquid between said template and said body.

8. The method as recited in claim 1, further including providing said template with an electrically conducting material.

9. A method of creating a pattern on a body, said method comprising:

disposing a liquid between a template and said body;

orientating said template proximate to said liquid; and moving a portion of said liquid between said template and said body toward said template to form a contiguous region of said liquid between two spaced-apart electric field gradients, with each of said electric field gradients being defined by first and second electric fields, with said first electric field being adjacent to said second electric field and said first electric field being greater than said second electric field.

10. The method as recited in claim 9, wherein said pattern comprises a topology selected from a group of topologies consisting essentially of recessed and protruded, smoothed, and planarized.

11. The method as recited in claim 9, wherein moving said portion of said liquid causes said portion of said liquid to contact a portion of said template.

12. The method as recited in claim 9 further including polymerizing said liquid, with said liquid comprising a polymerizable composition.

13. The method as recited in claim 12, wherein polymerizing said liquid occurs in the presence of said first and second electric fields.

14. A method of creating a pattern on a body, said method comprising:

disposing a polymerizable liquid on said body;

orientating said a template proximate to said polymerizable liquid;

moving a portion of said polymerizable liquid toward said template to form a contiguous region of said polymerizable liquid between two spaced-apart electric field gradients, with each of said electric field gradients being defined by first and second electric fields, with said first electric field being adjacent to said second electric field and said first electric field being greater than said second electric field; and polymerizing said polymerizable liquid.

15. The method as recited in claim 14, wherein disposing said liquid further includes disposing a low viscosity liquid.

16. The method as recited in claim 14, further includes providing said template with an electrically conducting material.

17. The method as recited in claim 14, wherein polymerizing said liquid occurs in the presence of said electric field.

* * * * *